(12) United States Patent
Inagaki et al.

(10) Patent No.: US 9,589,946 B2
(45) Date of Patent: Mar. 7, 2017

(54) CHIP WITH A BUMP CONNECTED TO A PLURALITY OF WIRINGS

(71) Applicant: KABUSHIKI KAISHA TOSHIBA, Minato-ku (JP)

(72) Inventors: Maya Inagaki, Yokohama (JP); Masaru Koyanagi, Tokyo (JP); Mikihiko Ito, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/844,602

(22) Filed: Sep. 3, 2015

(65) Prior Publication Data

US 2016/0322341 A1 Nov. 3, 2016

Related U.S. Application Data

(60) Provisional application No. 62/153,925, filed on Apr. 28, 2015.

(51) Int. Cl.
| | | |
|---|---|---|
| H01L 25/18 | (2006.01) |
| H01L 23/48 | (2006.01) |
| H01L 23/522 | (2006.01) |
| H01L 23/538 | (2006.01) |
| H01L 23/528 | (2006.01) |
| H01L 23/00 | (2006.01) |

(52) U.S. Cl.
CPC ............ *H01L 25/18* (2013.01); *H01L 23/481* (2013.01); *H01L 23/528* (2013.01); *H01L 23/5226* (2013.01); *H01L 23/5386* (2013.01); *H01L 24/06* (2013.01); *H01L 24/13* (2013.01); *H01L 24/29* (2013.01); *H01L 24/81* (2013.01)

(58) Field of Classification Search
CPC ......... H01L 24/16; H01L 24/81; H01L 24/13; H01L 23/5226; H01L 23/5386; H01L 24/29; H01L 24/06; H01L 23/528
See application file for complete search history.

(56) References Cited

U.S. PATENT DOCUMENTS

| | | | | |
|---|---|---|---|---|
| 6,780,748 B2* | 8/2004 | Yamaguchi | ......... | H01L 23/3114 257/E21.508 |
| 6,861,742 B2* | 3/2005 | Miyamoto | .............. | H01L 22/22 257/693 |
| 7,608,925 B2* | 10/2009 | Takinomi | ................ | H01L 24/06 257/724 |
| 7,982,301 B2* | 7/2011 | Danno | ................ | H03G 3/3036 257/684 |

(Continued)

FOREIGN PATENT DOCUMENTS

| | | |
|---|---|---|
| JP | 2003-7750 A | 1/2003 |
| JP | 2006-128658 A | 5/2006 |
| JP | 2011-253994 A | 12/2011 |

*Primary Examiner* — Alonzo Chambliss
(74) *Attorney, Agent, or Firm* — Oblon, McClelland, Maier & Neustadt, L.L.P.

(57) ABSTRACT

According to one embodiment, a semiconductor device includes a first semiconductor chip; a first wiring and a second wiring which are provided above a first surface of the first semiconductor chip; a first terminal connected to one end of the first wiring and one end of the second wiring, and connected to an outside; a second terminal connected to the other end of the first wiring; and a third terminal connected to the other end of the second wiring, and connected to the second terminal.

15 Claims, 6 Drawing Sheets

(56) References Cited

U.S. PATENT DOCUMENTS

| | | |
|---|---|---|
| 2003/0011071 A1 | 1/2003 | Kariyazaki |
| 2005/0040509 A1* | 2/2005 | Kikuchi ................ H01L 21/563 |
| | | 257/686 |
| 2006/0065982 A1 | 3/2006 | Komiya |
| 2011/0298127 A1 | 12/2011 | Seta et al. |
| 2014/0252612 A1* | 9/2014 | Nakagawa .............. H01L 23/12 |
| | | 257/738 |

* cited by examiner

CHIP WITH A BUMP CONNECTED TO A PLURALITY OF WIRINGS

CROSS REFERENCE TO RELATED APPLICATIONS

This application is based upon and claims the benefit of priority from U.S. Provisional Application No. 62/153,925, filed Apr. 28, 2015, the entire contents of all of which are incorporated herein by reference.

FIELD

Embodiments relate to a semiconductor device.

BACKGROUND

A multi-chip package has been proposed for increasing a memory capacity in a semiconductor device. In the multi-chip package, a plurality of core chips (semiconductor chips) are stacked on a package substrate and are packaged. As a method in which plural core chips are stacked, a TSV (Through Silicon Via) method has been proposed.

DETAILED DESCRIPTION

In the TSV method, a TSV is provided in each core chip, and TSVs among the core chips are connected by bumps (solder balls). In addition, a re-distribution layer (RDL) is provided on a lower surface of a lowermost core chip, and the core chip and a package substrate are connected through the re-distribution layer. Additionally, an interface chip is provided between the package substrate and core chip. The interface chip is connected to the package substrate and core chip through the re-distribution layer. Through such a re-distribution layer, a power supply voltage, a ground voltage and various signals are transferred between the chip and substrate.

The width of each wiring of the re-distribution layer is determined by design rules. Thus, the wiring width cannot freely be increased in order to lower the wiring resistance. Accordingly, when a power supply voltage or a ground voltage is supplied to the re-distribution layer, in particular, a plurality of (e.g. two) wirings are required as the re-distribution layer for an identical power supply voltage or an identical ground voltage in order to lower the wiring resistance. These plural wirings connect the core chip-side terminals or interface chip-side terminals, on one hand, and the package substrate-side terminals, on the other hand. At this time, because of restrictions on the process of the re-distribution layer, a closed loop cannot be provided by a plurality of wirings (an opening portion has to be provided). The reason for this is that, due to the formation of a closed loop, the width between wirings decreases or a pattern with an acute angle is formed, leading to difficulty in uniformly filling a resin (insulation layer) between wirings.

Figure 6:
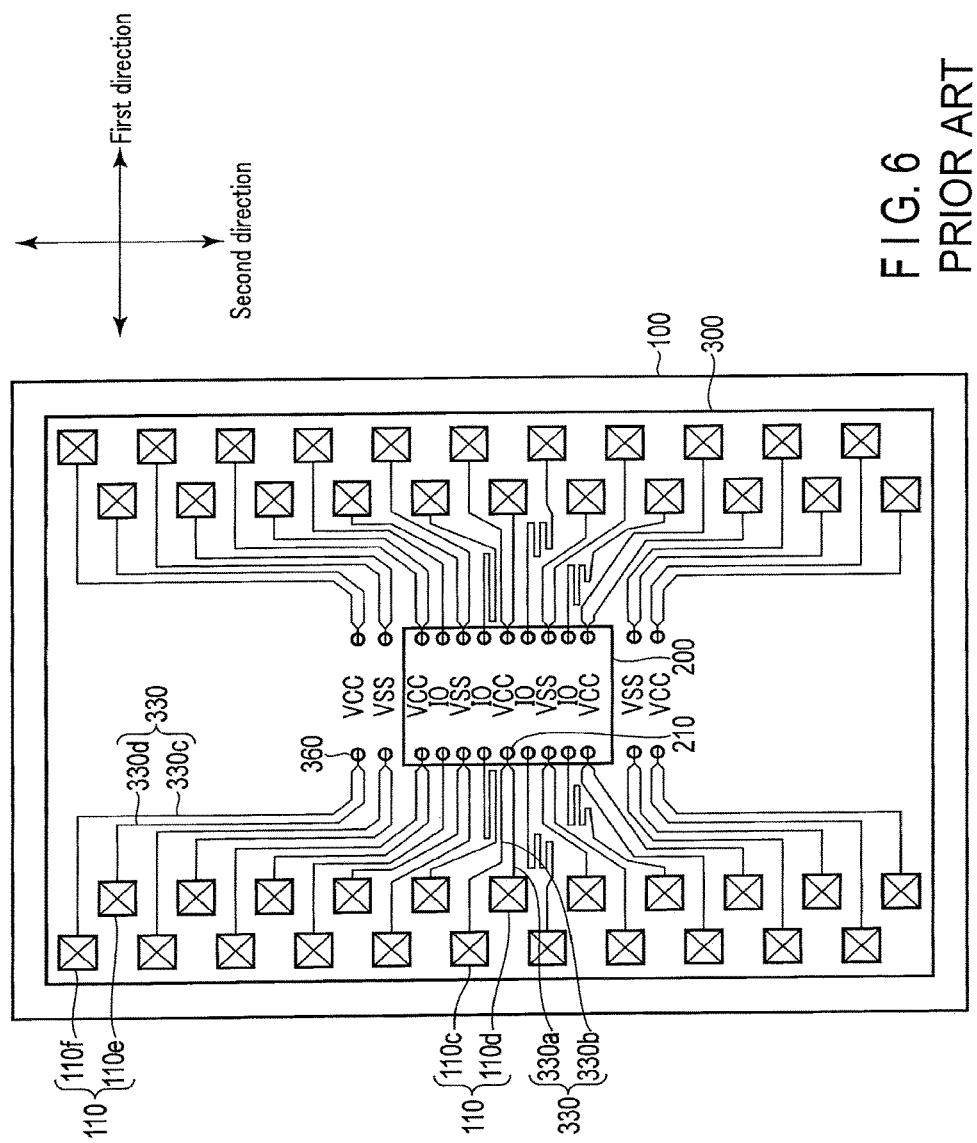
FIG. 6 is a plan view illustrating a semiconductor device according to a comparative example.

By contrast, as illustrated in FIG. 6, in a comparative example, when two (a pair of) wirings (wirings 330a, 330b, or wirings 330c, 330d) are formed as a re-distribution layer for an identical power supply voltage or an identical ground voltage, two terminals (bumps 110f, 110e, or bumps 110c, 110d) are provided on the package substrate 100. One end of one of the two wirings 330 and one end of the other of the two wirings 330 are connected to the two terminals 110, respectively. Thereby, the two wirings 330 have an opening portion at the terminals 100 on the package substrate 100 side. On the other hand, each of the other ends of the two wirings 330 is connected to one terminal (via 360 or bump 210) on the multilayer core chip 300 side or interface chip 200 side.

However, since the plural (two in this case) terminals 110 are provided on the package 100 side, the total number of terminals 110 on the package 100 side increases. In usual cases, the size/pitch of the terminal 110 on the package substrate 100 side is greater than the size/pitch of the terminal 360 on the multilayer core chip 300 side or the size/pitch of the terminal 210 on the interface 200 side. Thus, if the number of terminals 110 on the package substrate 100 side increases, the package size will increase.

Furthermore, if the number of terminals 110 on the package substrate 110 side increases, the distances from some terminals 110 to the terminals 360 on the multilayer core chip 300 side or the terminals 210 on the interface side increase due to the layout of the terminals 110. As a result, the wirings 330 between the terminals become longer, leading to such a problem that an increase occurs in wiring resistance, capacitance and inductance of signals, a power supply voltage and a ground voltage.

Besides, as regards high-speed signals such as IOs, in order to reduce a skew between IOs, the lengths of wirings need to be made uniform. In this case, the lengths of wirings 330 need to be set to agree with the length of the longest wiring (wiring with a long distance between terminals) 330 among them. Thus, even a wiring 330 with a short distance between terminals has to be provided with a redundant wiring portion and has to be made to agree in length with the longest wiring 330. As a result, the density of wirings 330 increases, and design becomes difficult.

In general, according to one embodiment, a semiconductor device includes a first semiconductor chip; a first wiring and a second wiring which are provided above a first surface of the first semiconductor chip; a first terminal connected to one end of the first wiring and one end of the second wiring, and connected to an outside; a second terminal connected to the other end of the first wiring; and a third terminal connected to the other end of the second wiring, and connected to the second terminal.

Embodiments will be described hereinafter with reference to the accompanying drawings. In the drawings, the same parts are denoted by like reference numerals.

<Embodiment>

Referring now to FIG. 1 to FIG. 5, a semiconductor device according to an embodiment is described.

In the embodiment, for example, two wirings 330a, 330b (or 330c, 330d) for an identical power supply voltage or an identical ground voltage are provided in a re-distribution layer 380. In association with these wirings 330a, 330b (or 330c, 330d), one bump 110a (or bump 110b) is provided on a package substrate 100 side, and two bumps 210a, 210b are provided on an interface 200 side (or two vias 360c, 360d on a multilayer core chip 300 side). Thereby, the number of large-size bumps 110 can be decreased, and the wirings 330 in the re-distribution layer 380 can advantageously be shortened. The embodiment will be described below in detail.

[Configuration in the Embodiment]

Referring to FIG. 1 to FIG. 5, the configuration of the semiconductor device according to the embodiment is described.

Figure 1:
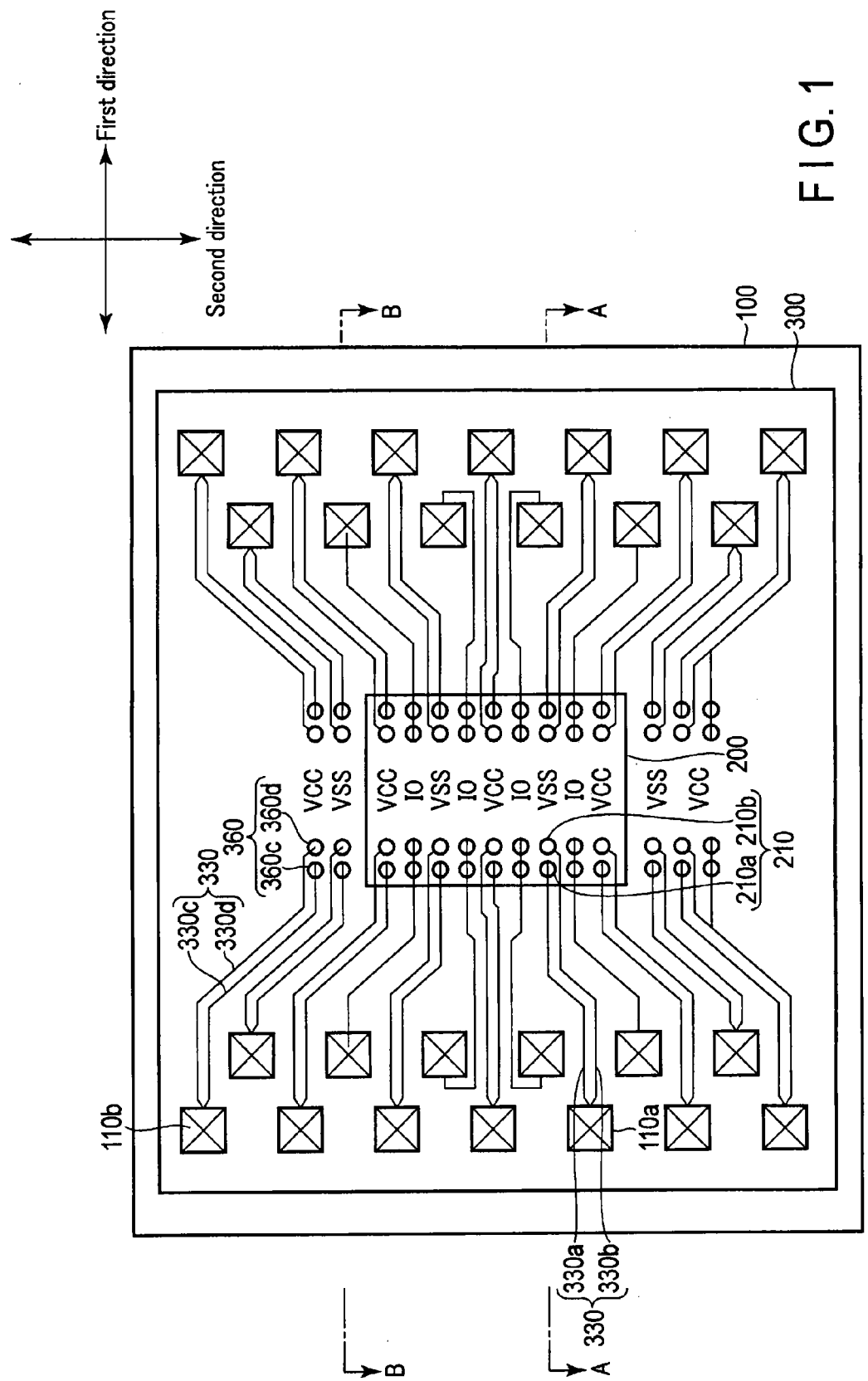
FIG. 1 is a plan view illustrating a semiconductor device according to an embodiment.

FIG. 1 is a plan view illustrating the semiconductor device according to the embodiment.

As illustrated in FIG. 1, the semiconductor device of the embodiment includes a package substrate 100, an interface chip 200, and a multilayer core chip 300.

The interface chip 200 and multilayer chip 300 are mounted on the package substrate 100. The package substrate 100 is connected to an outside, and a power supply voltage VCC or a ground voltage VSS is supplied to the package substrate 100 from the outside. The package substrate 100 directly supplies the power supply voltage VCC or ground voltage VSS from the outside to the multilayer core chip 300. The package substrate 100 supplies the power supply voltage VCC or ground voltage VSS to the interface chip 200. Alternatively, the package substrate 100 supplies the power supply voltage VCC or ground voltage VSS to the multilayer core chip 300 through the interface chip 200. Incidentally, in the case where the interface chip 200 intervenes, the package substrate 100 supplies not only the voltage but also signals IO from the outside (data signals and command signals) to the core chip 300.

The multilayer core chip 300 includes, for example, a memory circuit such as a NAND flash memory, and a memory controller. The multilayer core chip 300 stores data, etc. from the outside.

The interface chip 200 includes an interface circuit. The interface circuit is composed of a logic circuit, an analog circuit, etc. The interface chip 200 transfers a signal IO, a power supply voltage and a ground voltage between the package substrate 100 and multilayer core chip 300.

In plan view, the multilayer core chip 300 is provided within the package substrate 100. In addition, the interface chip 200 is provided at a central part of the multilayer core chip 300. The size of the package substrate 100 is determined by the size of the multilayer core chip 300, and the package size is determined by these.

In plan view, a plurality of bumps 110, a plurality of wirings 330 and a plurality of vias 360 are provided within the plan-view size of the multilayer core chip 300. In addition, a plurality of bumps 210 are provided in the interface chip 200.

The plural bumps 110 are provided at both end portions of the multilayer core chip 300 in a first direction (left-and-right direction in the Figure), and are arranged, for example, in two columns, in a second direction (up-and-down direction in the Figure) at each of both end portions. In addition, the plural bumps 110 arranged in the first column and the plural bumps 110 arranged in the second column are disposed in a staggering fashion. The plural bumps 110 are terminals which are electrically connected to the package substrate 100. Any one of the signal IO, power supply voltage VCC and ground voltage VSS is supplied from the outside to each bump 110.

The plural bumps 210 are provided at both end portions of the interface chip 200 in the first direction, and are arranged in two columns in the second direction at each of both end portions. The plural bumps 210 are terminals which are electrically connected to the multilayer core chip 300 through the interface chip 200. An identical signal IO, an identical power supply voltage VCC or an identical ground voltage VSS is supplied to a pair of bumps 210a, 210b, which are juxtaposed in the first direction.

The plural vias 360 are arranged outside the interface chip 200, in the same columns as the plural bumps 210 in the second direction. The plural vias 360 are terminals which are electrically connected to the core chip 300. An identical power supply voltage VDD or an identical ground voltage VCC is supplied to a pair of vias 360c, 360d, which are juxtaposed in the first direction.

The wirings 330 connect any one of the bumps 110 and a pair of bumps 210, or connect any one of the bumps 110 and a pair of vias 360.

To be more specific, one end of the wiring 330a and one end of the wiring 330b are electrically connected to the same bump 110a. In addition, the other end of the wiring 330a is electrically connected to the bump 210a, and the other end of the wiring 330b is electrically connected to the bump 210b. Thereby, the wiring 330a and wiring 330b have an opening portion on the interface chip 200 side (on the side of bumps 210a, 210b). The bump 210a and bump 210b are electrically connected within the interface chip 200. In addition, the bump 210a and bump 210b may be electrically connected to the multilayer core chip 300 through the interface chip 200.

Additionally, one end of the wiring 330c and one end of the wiring 330d are electrically connected to the same bump 110b. In addition, the other end of the wiring 330c is electrically connected to the via 360c, and the other end of the wiring 330d is electrically connected to the via 360d. Thereby, the wiring 330c and wiring 330d have an opening portion on the multilayer core chip 300 side (on the side of vias 360c, 360d). The via 360c and via 360d are electrically connected within the multilayer core chip 300.

Besides, the distances between the plural bumps 110 for the signal IO, on one hand, and the plural bumps 210, on the other hand, are different. All of these are electrically connected by the wirings 330 of the same length. Thus, a redundant wiring portion is provided at a part between the bump 110 and bump 210, the distance between which is short. Here, the redundant wiring portion is a portion of the wiring 330, which is redundantly elongated between the bump 110 and bump 210, and actually has a function of transferring the signal IO.

Although the bump 110, and the bumps 210 or vias 360, are connected by the two (pair of) wirings 330, these may be connected by three or more wirings. In this case, the number of wirings 330 becomes identical to the number of bumps 210 or vias 360. In addition, in FIG. 1, although one wiring 330 is used for the signal IO, two (a pair of) wirings 330 may be used like the wirings for the power supply voltage and ground voltage.

Figure 2:
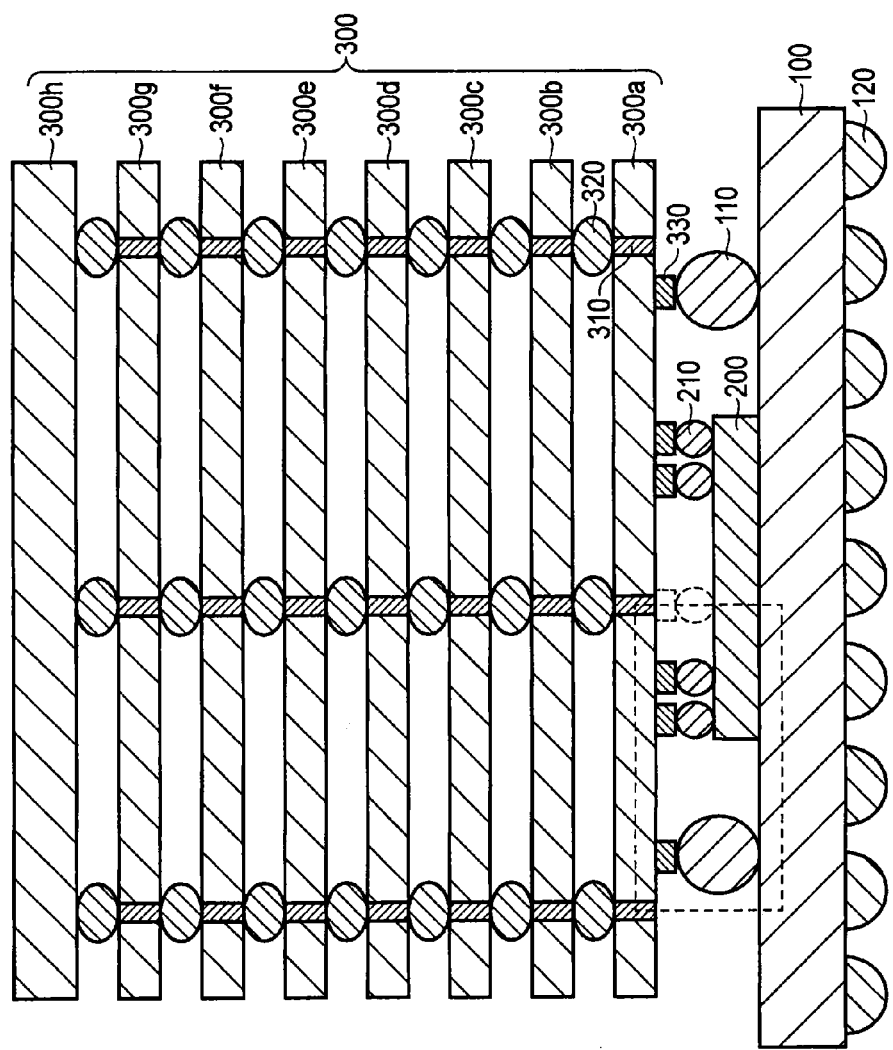
FIG. 2 is a cross-sectional view, taken along line A-A in FIG. 1, illustrating the semiconductor device according to the embodiment.

FIG. 2 is a cross-sectional view, taken along line A-A in FIG. 1, illustrating the semiconductor device according to the embodiment.

As illustrated in FIG. 2, in a line A-A cross section, bumps 120 are provided on the lower surface of the package substrate (semiconductor substrate) 100. In the case in which the semiconductor device is a BGA package, the bumps 120 are solder balls. The package substrate 100 is electrically connected to the outside through the bumps 120.

The interface chip (semiconductor chip) 200 is provided on the upper surface of the package substrate 100.

The multilayer core chip 300 is provided above the upper surfaces of the interface chip 200 and package substrate 100. The multilayer core chip 300 includes a plurality of core chips (semiconductor chips) 300a to 300h. The plural core chips 300a to 300h are successively stacked from the lower side. A TSV (Through Silicon Via) 310 is provided in each of the core chips 300a to 300g, excluding the uppermost core chip 300h, the TSV 310 reaching from the upper surface to the lower surface of each core chip. In addition, bumps 320 are provided between the TSVs 310.

The wirings 330 are provided on the lower surface of the lowermost core chip 300a. The bumps 210 are provided between the wirings 330 and the interface chip 200. On the other hand, the bumps 110 are provided between the wirings 330 and the package substrate 100. The distance between the wiring 330 and interface chip 200 is less than the distance between the wiring 330 and package substrate 100. Accordingly, the size (e.g. plan-view size) of the bump 210 is less than the size of the bump 110.

Hereinafter, referring to FIG. 3, a description is given of a cross section illustrating in greater detail connections of the package substrate 100, interface chip 200 and core chip 300.

Figure 3:
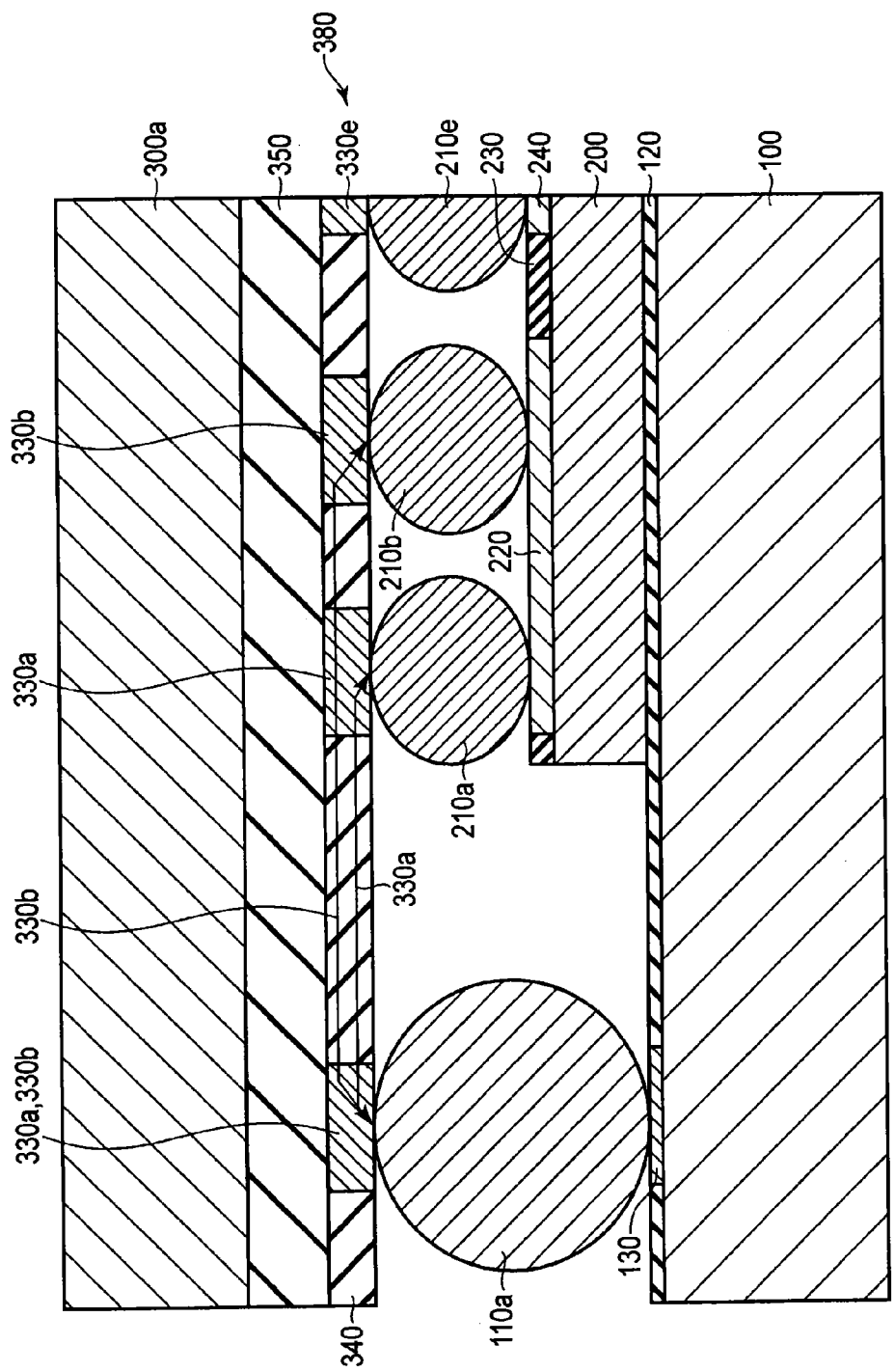
FIG. 3 is a cross-sectional view illustrating, in enlarged scale, a broken-line part in FIG. 2.

FIG. 3 is a cross-sectional view illustrating, in enlarged scale, a broken-line part in FIG. 2. Incidentally, for the purpose of convenience in description, FIG. 3 illustrates the bump 110a and the bumps 210a, 210b, 210c, which are disposed in different cross sections.

As illustrated in FIG. 3, an insulation layer 120 is provided on the upper surface of the package substrate 100. The interface chip 200 is provided on this insulation layer 120. Thus, the upper surface of the package substrate 100 and the lower surface of the interface 200 are insulatively isolated. In addition, an electrode pad 130 is provided on the upper surface of the package substrate 100.

Electrode pads 220 and 240 and an insulation layer 230 are provided on the upper surface of the interface 200.

An insulation layer 350 is provided on the lower surface of the lowermost core chip 300a, and a re-distribution layer 380 is provided on the lower surface of this insulation layer 350. The re-distribution layer 380 includes the wirings 330 (wirings 330a, 330b, 330c) and an insulation layer 340. The insulation layer 340 is formed of, for example, a resin.

The bump 110a is provided between the wirings 330a, 330b and the electrode pad 130. In addition, the bump 210a is provided between the wiring 330a and electrode pad 220, and the bump 210b is provided between the wiring 330b and electrode pad 220.

Specifically, the package substrate 100 and interface chip 200 are electrically connected through the electrode pad 130, bump 110a, wiring 330a, bump 210a and electrode pad 220, and are also electrically connected through the electrode pad 130, bump 110a, wiring 330b, bump 210b and electrode pad 220.

In addition, the electrode pad 220 is electrically connected to the electrode pad 240 through the inside of the interface chip 200. A bump 210e is provided between a wiring 330e and the electrode pad 240. Specifically, the electrode pad 220 is further electrically connected to the core chip 300a (multilayer core chip 300) through the interface chip 200, electrode pad 240, bump 210e and wiring 330e.

Figure 4:
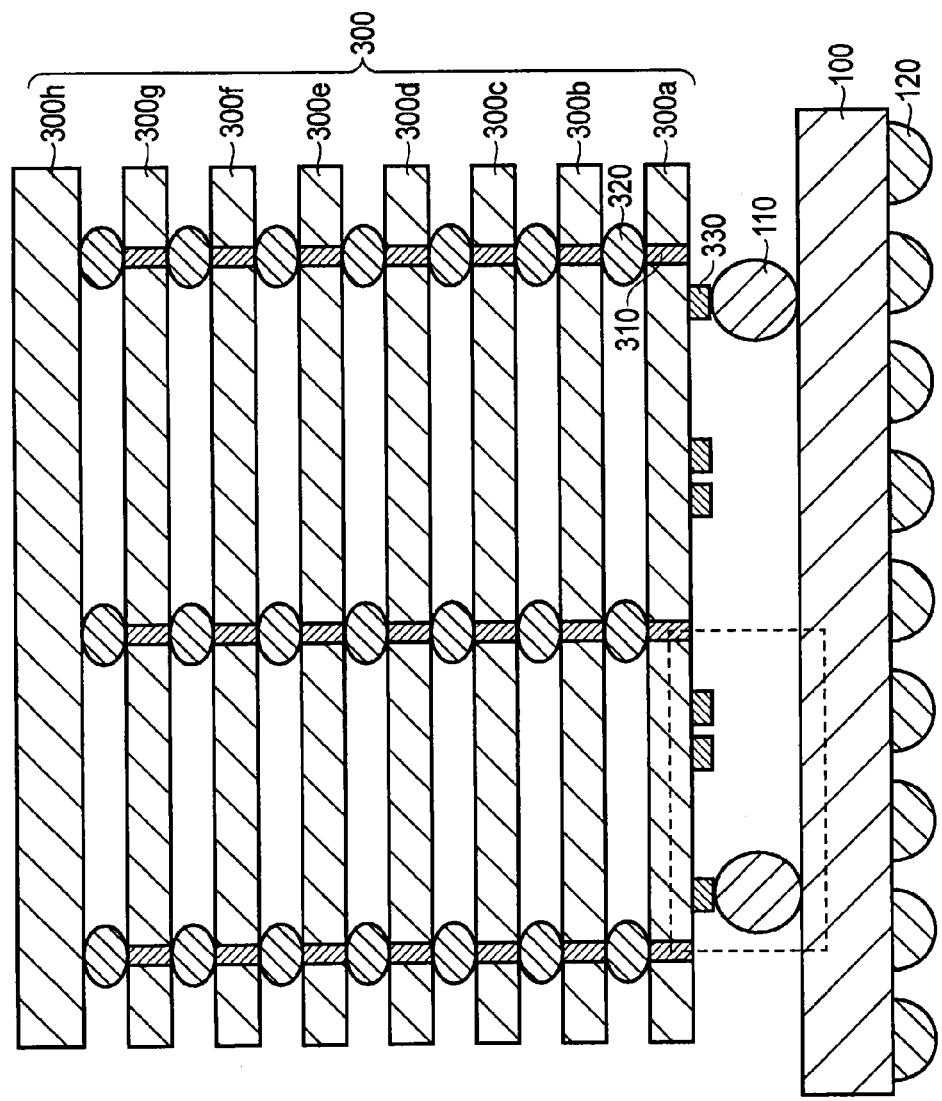
FIG. 4 is a cross-sectional view, taken along line B-B in FIG. 1, illustrating the semiconductor device according to the embodiment.

FIG. 4 is a cross-sectional view, taken along line B-B in FIG. 1, illustrating the semiconductor device according to the embodiment.

As illustrated in FIG. 4, in the line B-B cross section, unlike the line A-A cross section, the interface chip 200 and bumps 210 are not provided on the upper surface of the package substrate 100. In addition, parts of the wirings 330 are electrically connected to the core chip 300a without intervention of the interface chip 200.

Hereinafter, referring to FIG. 5, a description is given of a cross section illustrating in greater detail connections of the package substrate 100 and core chip 300.

Figure 5:
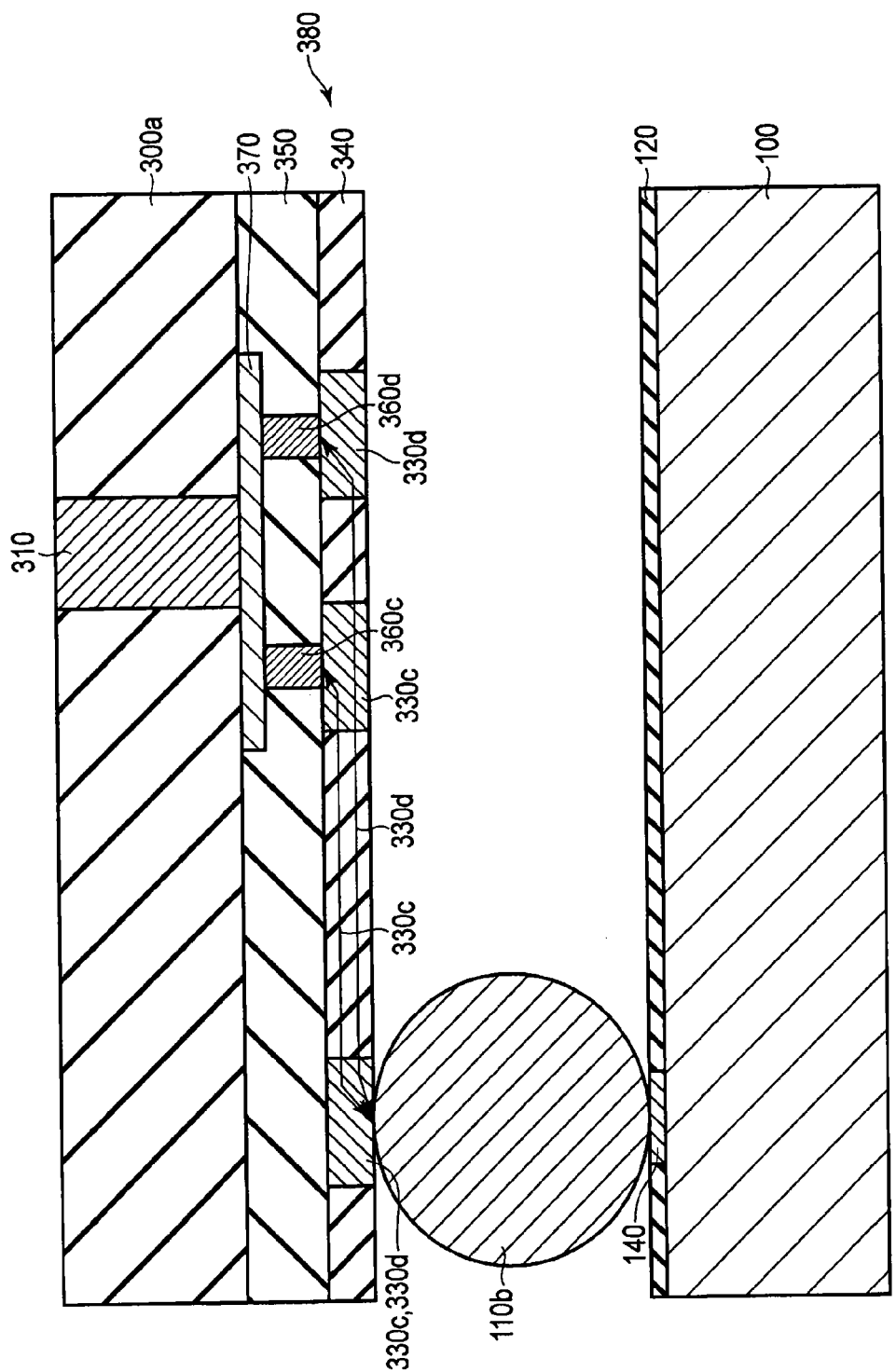
FIG. 5 is a cross-sectional view illustrating, in enlarged scale, a broken-line part in FIG. 4.

FIG. 5 is a cross-sectional view illustrating, in enlarged scale, a broken-line part in FIG. 4. Incidentally, for the purpose of convenience in description, FIG. 5 illustrates the bump 110b and the vias 360c, 360d, which are disposed in different cross sections.

As illustrated in FIG. 5, an insulation layer 120 and an electrode pad 140 are provided on the upper surface of the package substrate 100.

An electrode pad 370 is provided on the lower surface of the lowermost core chip 300a. The electrode pad 370 is electrically connected to the TSV 310 in the core chip 300a. An insulation layer 350 is provided in a manner to cover the electrode pad 370, and a re-distribution layer 380 is provided on the lower surface of this insulation layer 350. The re-distribution layer 380 includes wirings 330 (wirings 330c, 330d) and an insulation layer 340.

The bump 110b is provided between the wiring 330c, 330d and the electrode pad 140. In addition, the via 360c is provided in the insulation layer 350 and between the wiring 330c and electrode pad 370, and the via 360d is provided in the insulation layer 350 and between the wiring 330d and electrode pad 370. Here, the size (e.g. plan-view size) of the via 360 is less than the size of the bump 110.

Specifically, the package substrate 100 and core chip 300a (multilayer core chip 300) are electrically connected through the electrode pad 140, bump 110b, wiring 330c, via 360c and electrode pad 370, and are also electrically connected through the electrode pad 140, bump 110b, wiring 330d, via 360d and electrode pad 370.

[Advantageous Effects in the Embodiment]

According to the present embodiment, for example, two wirings 330a, 330b for an identical power supply voltage or an identical ground voltage are provided in the re-distribution layer 380. The wirings 330a, 330b supply a power supply voltage VCC or a ground voltage VSS to the interface chip 200. In association with these wirings 330a, 330b, one terminal (bump 110a) is provided on the package substrate 100 side, and two terminals (bumps 210a, 210b) are provided on the interface 200 side. In addition, while one end of the wiring 330a and one end of the wiring 330b are commonly connected to the bump 110a, the other ends of the wirings 330a and 330b are connected to the bumps 210a, 210b, respectively. Thereby, an opening portion of the wirings 330a, 330b is provided by increasing the number of bumps 210 on the interface chip 200 side. Specifically, the wirings 330a, 330b are provided without increasing the number of large-sized bumps 110 on the package substrate 100 side.

By the above-described configuration, the number of large-sized bumps 110 can be decreased, compared to the comparative example illustrated in FIG. 6. Thereby, the sizes of the multilayer core chip 300 and package substrate 100 can be decreased, and the package size can be reduced.

In addition, since the number of bumps 110 decreases, the distances between the bumps 110, which are located at chip ends, and bumps 210, can be decreased, compared to the comparative example. As a result, the wirings 330 between the terminals are shortened, and the wiring resistance, capacitance and inductance can be reduced.

Furthermore, of the plural wirings 330 for IO, the wiring 330 with the greatest length can be made shorter than in the comparative example. Thereby, the difference in wiring length among the plural wirings for IO can be decreased, and an excess redundant wiring portion can be reduced.

Additionally, by decreasing the wiring length or reducing the redundant wiring portion, the design of wiring can be facilitated. Moreover, since the degree of freedom in wiring design is increased, the device characteristics can be more easily improved.

Besides, according to the present embodiment, for example, two wirings 330c, 330d for an identical power supply voltage or an identical ground voltage are provided in the re-distribution layer 380. The wirings 330c, 330d supply a power supply voltage or a ground voltage to the multilayer core chip 300. In association with these wirings 330c, 330d, one terminal (bump 110) is provided on the package substrate 100 side, and two terminals (vias 360c, 360d) are provided on the multilayer core chip 300 side. In addition, while one end of the wiring 330c and one end of the wiring 330d are commonly connected to the bump 110, the other ends of the wirings 330c and 330d are connected to the vias 360c, 360d, respectively. Thereby, the same advantageous effects as described above can be obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor chip;
a first wiring and a second wiring which are provided above a first surface of the first semiconductor chip;
a first terminal connected to one end of the first wiring and one end of the second wiring, and connected to an outside;
a second terminal connected to the other end of the first wiring; and
a third terminal connected to the other end of the second wiring, and connected to the second terminal,
wherein the second terminal and the third terminal are connected to an inside of the first semiconductor chip,
the second terminal is a first via provided between the first wiring and the first semiconductor chip, and
the third terminal is a second via provided between the second wiring and the first semiconductor chip.

2. The device of claim 1, wherein a size of the first terminal is greater than a size of the second terminal and the third terminal.

3. The device of claim 1, further comprising a first electrode pad provided between the first semiconductor chip, and the first via and the second via, and configured to connect the first via and the second via.

4. The device of claim 1, further comprising a substrate, the substrate having a first surface connected to an outside through a first bump, and having a second surface opposed to the first surface of the first semiconductor chip,
wherein the first terminal is a second bump provided between the substrate, and the first wiring and the second wiring.

5. The device of claim 1, wherein the first semiconductor chip includes a memory circuit configured to store data.

6. A semiconductor device comprising:
a first semiconductor chip;
a first wiring and a second wiring which are provided above a first surface of the first semiconductor chip;
a first terminal connected to one end of the first wiring and one end of the second wiring, and connected to an outside;
a second terminal connected to the other end of the first wiring;
a third terminal connected to the other end of the second wiring, and connected to the second terminal,
a substrate, the substrate having a first surface connected to an outside through a first bump, and having a second surface opposed to the first surface of the first semiconductor chip, and
a second semiconductor chip provided between the substrate and the first semiconductor chip, and on the second surface of the substrate,
wherein the first terminal is a second bump provided between the substrate, and the first wiring and the second wiring,
the second terminal is a third bump provided between the first wiring and the second semiconductor chip, and
the third terminal is a fourth bump provided between the second wiring and the second semiconductor chip.

7. The device of claim 6, further comprising a second electrode pad provided between the second semiconductor chip, and the third bump and the fourth bump, the second electrode pad configured to connect the third bump and the fourth bump.

8. The device of claim 7, wherein the second electrode pad is connected to the first semiconductor chip through the second semiconductor chip.

9. The device of claim 6, wherein the second semiconductor chip includes an interface circuit configured to transfer a signal and a voltage between the substrate and the first semiconductor chip.

10. A semiconductor device comprising:
a first semiconductor chip;
a first wiring and a second wiring which are provided above a first surface of the first semiconductor chip,
a first terminal connected to one end of the first wiring and one end of the second wiring, and connected to an outside;
a second terminal connected to the other end of the first wiring;
a third terminal connected to the other end of the second wiring, and connected to the second terminal,
a second semiconductor chip provided above a second surface of the first semiconductor chip; and
a first bump provided between the first semiconductor chip and the second semiconductor chip,
a first electrode reaching from an upper surface of the first semiconductor chip to a lower surface of the first semiconductor chip,
wherein the first semiconductor chip and the second semiconductor chip are connected through the first electrode and the first bump.

11. The device of claim 10, further comprising:
a third semiconductor chip provided above the second semiconductor chip;
a second bump provided between the second semiconductor chip and the third semiconductor chip; and
a second electrode reaching from an upper surface of the second semiconductor chip to a lower surface of the second semiconductor chip, wherein the first semiconductor chip, the second semiconductor chip and the third semiconductor chip are connected through the first electrode, the first bump, the second electrode and the second bump.

12. The device of claim 11, wherein each of the first semiconductor chip, the second semiconductor chip and the third semiconductor chip includes a memory circuit configured to store data.

13. The device of claim 11, further comprising a substrate, the substrate having a first surface connected to an outside through a third bump, and having a second surface opposed to the first surface of the first semiconductor chip,
wherein the first terminal is a fourth bump provided between the substrate, and the first wiring and the second wiring.

14. The device of claim 13, further comprising a fourth semiconductor chip provided between the substrate and the first semiconductor chip, and on the second surface of the substrate,
wherein the second terminal and the third terminal are connected to an inside of the fourth semiconductor chip,
the second terminal is a fifth bump provided between the first wiring and the fourth semiconductor chip, and
the third terminal is a sixth bump provided between the second wiring and the fourth semiconductor chip.

15. The device of claim 14, wherein the fourth semiconductor chip includes an interface circuit configured to transfer a signal and a voltage between the substrate, the first semiconductor chip, the second semiconductor chip and the third semiconductor chip.

* * * * *